United States Patent
Beer et al.

(10) Patent No.: US 9,553,035 B2
(45) Date of Patent: Jan. 24, 2017

(54) SEMICONDUCTOR ARRANGEMENT, METHOD FOR PRODUCING A NUMBER OF CHIP ASSEMBLIES AND METHOD FOR PRODUCING A SEMICONDUCTOR ARRANGEMENT

(71) Applicant: Infineon Technologies AG, Neubiberg (DE)

(72) Inventors: Gottfried Beer, Nittendorf (DE); Edward Fuergut, Dasing (DE); Juergen Hoegerl, Regensburg (DE); Olaf Hohlfeld, Warstein (DE); Peter Kanschat, Soest (DE)

(73) Assignee: Infineon Technologies AG, Neubiberg (DE)

( * ) Notice: Subject to any disclaimer, the term of this patent is extended or adjusted under 35 U.S.C. 154(b) by 49 days.

(21) Appl. No.: 14/462,693

(22) Filed: Aug. 19, 2014

(65) Prior Publication Data
US 2015/0054166 A1 Feb. 26, 2015

(30) Foreign Application Priority Data

Aug. 22, 2013 (DE) .................. 10 2013 216 709

(51) Int. Cl.
| H01L 23/34 | (2006.01) |
| H01L 23/31 | (2006.01) |
| H01L 21/56 | (2006.01) |
| H01L 21/78 | (2006.01) |

(Continued)

(52) U.S. Cl.
CPC .............. *H01L 23/31* (2013.01); *H01L 21/56* (2013.01); *H01L 21/78* (2013.01); *H01L 22/10* (2013.01);

(Continued)

(58) Field of Classification Search
CPC .... H01L 23/051; H01L 23/16; H01L 23/4334; H01L 24/33; H01L 2924/351

(Continued)

(56) References Cited

U.S. PATENT DOCUMENTS 3,648,121 A * 3/1972 Suenaga ................ H01L 21/56
257/700
6,281,569 B1 8/2001 Sugiyama (Continued)

*Primary Examiner* — Nitin Parekh
(74) *Attorney, Agent, or Firm* — Murphy, Bilak & Homiller, PLLC

(57) ABSTRACT

A semiconductor arrangement includes a plurality of chip assemblies, each of which includes a semiconductor chip having a semiconductor body with a top side and an underside, a top main electrode arranged on the top side, a bottom main electrode arranged on the underside, an electrically conductive top compensation lamina arranged on a side of the top main electrode facing away from the semiconductor body and cohesively and electrically conductively connected to the top main electrode, an electrically conductive bottom compensation lamina arranged on a side of the bottom main electrode facing away from the semiconductor body and cohesively and electrically conductively connected to the bottom main electrode, and a dielectric embedding compound enclosing the semiconductor chip laterally circumferentially in a ring-shaped fashion such that the side of the compensation laminae facing away from the semiconductor body are at least not completely covered by the embedding compound.

12 Claims, 11 Drawing Sheets

(51) Int. Cl.
 *H01L 21/66* (2006.01)
 *H01L 23/522* (2006.01)
 *H01L 27/02* (2006.01)
 *H01L 23/00* (2006.01)
 *H01L 23/051* (2006.01)

(52) U.S. Cl.
 CPC ........... *H01L 23/051* (2013.01); *H01L 23/522* (2013.01); *H01L 24/96* (2013.01); *H01L 27/02* (2013.01); *H01L 21/563* (2013.01); *H01L 2224/04105* (2013.01); *H01L 2224/06181* (2013.01); *H01L 2924/12042* (2013.01); *H01L 2924/1301* (2013.01); *H01L 2924/1305* (2013.01); *H01L 2924/13055* (2013.01); *H01L 2924/13091* (2013.01)

(58) Field of Classification Search
 USPC .................................. 257/718, 707, 713, 778
 See application file for complete search history.

(56) References Cited

U.S. PATENT DOCUMENTS

| | | | |
|---|---|---|---|
| 6,404,063 B2* | 6/2002 | Farnworth | H01L 23/32 257/723 |
| 6,803,667 B2* | 10/2004 | Okura | H01L 23/293 257/666 |
| 7,538,436 B2 | 5/2009 | Gunturi et al. | |
| 7,586,180 B2* | 9/2009 | Hata | H01L 23/49562 257/276 |
| 7,663,212 B2* | 2/2010 | Otremba | H01L 23/492 257/678 |
| 8,994,168 B2* | 3/2015 | Sato | H01L 23/3677 257/675 |
| 2001/0011757 A1 | 8/2001 | Miyake et al. | |
| 2004/0251540 A1* | 12/2004 | Eguchi | H01L 21/56 257/713 |
| 2007/0052072 A1* | 3/2007 | Iwade | H01L 23/051 257/675 |
| 2007/0267739 A1* | 11/2007 | Kajiwara | H01L 23/16 257/707 |
| 2008/0224282 A1* | 9/2008 | Ashida | H01L 21/565 257/669 |
| 2011/0062600 A1* | 3/2011 | Ueno | H01L 23/051 257/784 |
| 2014/0015000 A1* | 1/2014 | Nishiyama | C08J 5/18 257/100 |
| 2014/0131753 A1* | 5/2014 | Ishida | H01L 25/0753 257/98 |

\* cited by examiner

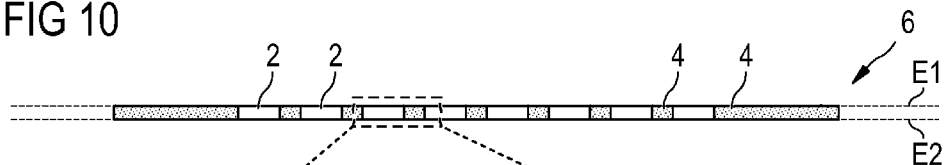
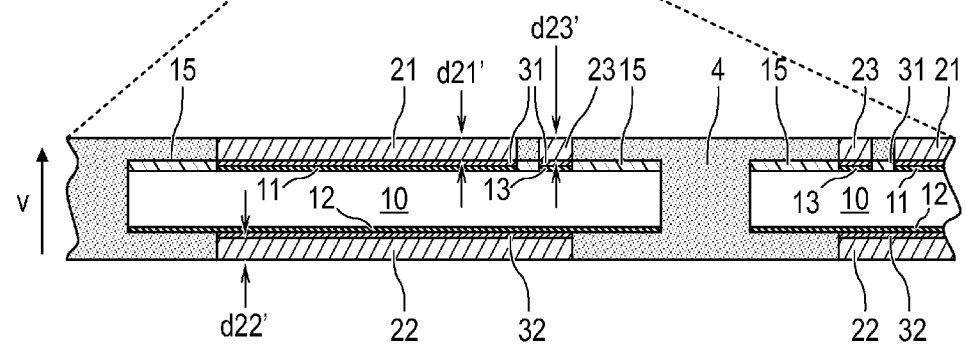
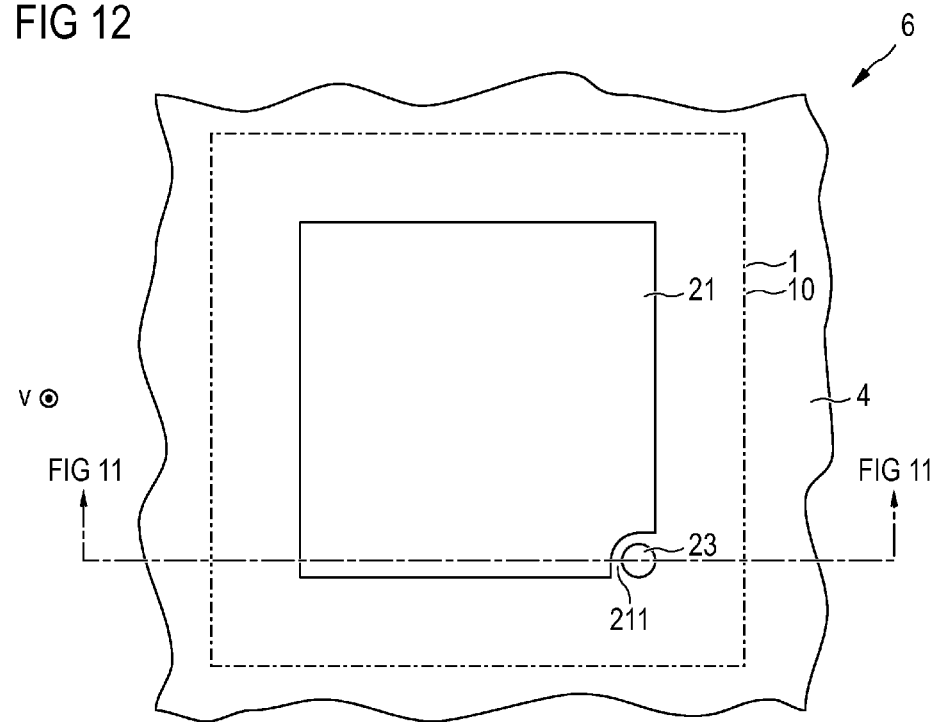

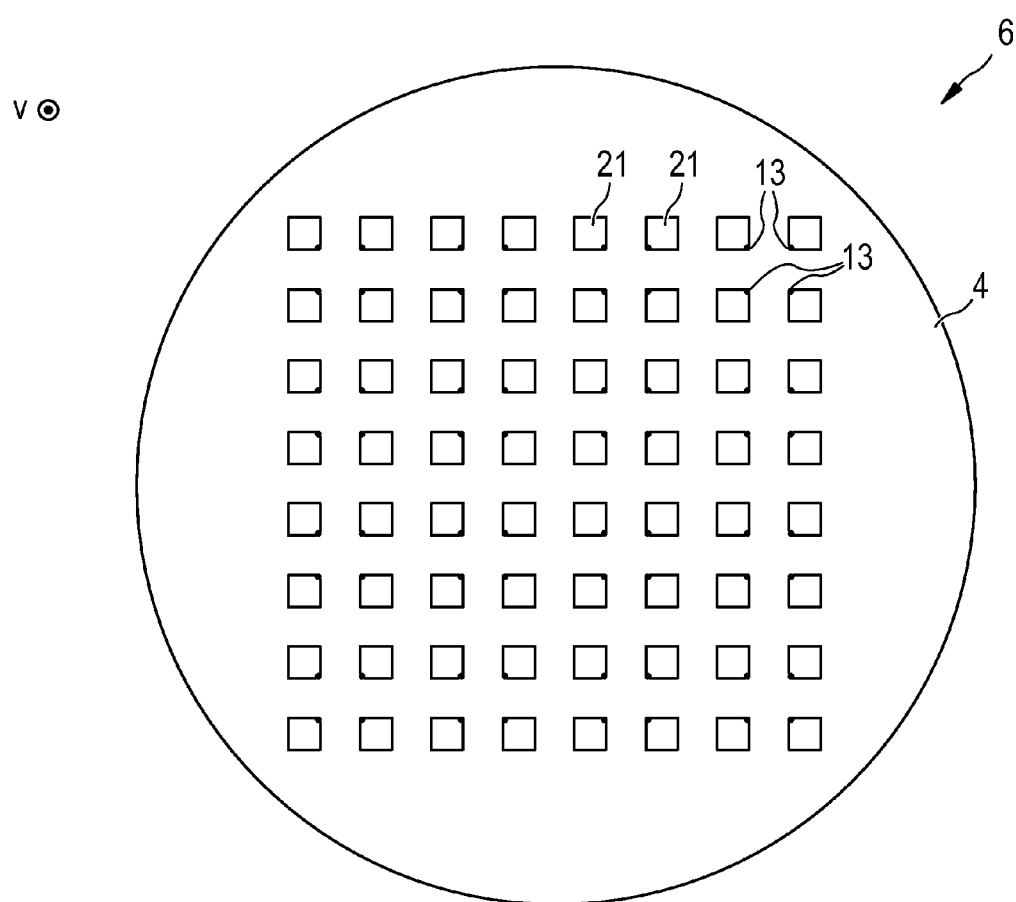

SEMICONDUCTOR ARRANGEMENT, METHOD FOR PRODUCING A NUMBER OF CHIP ASSEMBLIES AND METHOD FOR PRODUCING A SEMICONDUCTOR ARRANGEMENT

PRIORITY CLAIM

This application claims priority to German Patent Application No. 10 201 3 216 709.1, filed on 22 Aug. 2013, the content of said German application incorporated herein by reference in its entirety.

TECHNICAL FIELD

The following description relates to a semiconductor arrangement, a method for producing a number of chip assemblies and a method for producing a semiconductor arrangement.

BACKGROUND

Arrangements comprising press pack cells that are currently commercially available have a complex construction in order that the semiconductor chips contained in the press pack cells are electrically connected to the terminal contacts of the cell, for example emitter and collector, source and drain or anode and cathode.

Therefore, there is a need for an improved design of such arrangements, and for an improved production method.

SUMMARY

A semiconductor arrangement comprises a top contact plate and a bottom contact plate, and a number of chip assemblies. Each of the chip assemblies has a semiconductor chip having a semiconductor body having a top side and an underside opposite the top side, and a top main electrode arranged on the top side, and a bottom main electrode arranged on the underside.

An electrically conductive top compensation lamina is in each case arranged on the side of the top main electrode facing away from the semiconductor body and is cohesively and electrically conductively connected to the top main electrode by means of a top connecting layer. Correspondingly, an electrically conductive bottom compensation lamina is in each case arranged on the side of the bottom main electrode facing away from the semiconductor body and is cohesively and electrically conductively connected to the bottom main electrode by means of a bottom connecting layer. The cohesive connection prevents disturbing foreign bodies or other substances from passing between the main electrode and the compensation lamina cohesively connected thereto and prevents the main electrode and the semiconductor body from being damaged as a result.

Main electrodes in this sense are understood to mean electrodes between which a load current flows through the semiconductor body during the operation of the semiconductor chip. The semiconductor chip can contain, for example, a diode, or a MOSFET, an IGBT, generally an IGFET, a bipolar transistor, a thyristor, or any other controllable power semiconductor component. The top and bottom main electrodes can generally be anode and cathode, cathode and anode, drain and source, source and drain, emitter and collector or collector and emitter of an arbitrary power semiconductor component integrated into the respective semiconductor chip. If the power semiconductor component is a controllable power semiconductor component, that is to say a power semiconductor component having a control terminal such as e.g. a gate terminal (e.g. MOSFET, IGBT, IGFET, thyristor) or a base terminal (e.g. bipolar transistor excluding IGBT).

Furthermore, each of the chip assemblies has a dielectric embedding compound, which encloses the semiconductor chip laterally circumferentially in a ring-shaped fashion in such a way that the side of the top compensation lamina facing away from the semiconductor body and the side of the bottom compensation lamina facing away from the semiconductor body are in each case not covered or at least not completely covered by the embedding compound. These sides are therefore exposed with respect to the embedding compound and can thus be subjected to electrical pressure contact-connection. Each of the chip assemblies is arranged between the top contact plate and the bottom contact plate in such a way that in this chip assembly the side of the top compensation lamina facing away from the semiconductor body makes electrical and mechanical contact with the top contact plate, and that the side of the bottom compensation lamina facing away from the semiconductor body makes electrical and mechanical contact with the bottom contact plate.

In a method for producing a number of such chip assemblies, a carrier, a dielectric embedding compound and a number of semiconductor chip arrangements are provided. Each of the semiconductor chip arrangements has a semiconductor chip having a semiconductor body. The semiconductor body has in each case a top side and an underside opposite the top side, a top main electrode arranged on the top side, a bottom main electrode arranged on the underside, an electrically conductive top compensation lamina and an electrically conductive bottom compensation lamina. The electrically conductive top compensation lamina is arranged on the side of the top main electrode facing away from the semiconductor body and is cohesively and electrically conductively connected to said electrode by means of a top connecting layer. Correspondingly, the electrically conductive bottom compensation lamina is arranged on the side of the bottom main electrode facing away from the semiconductor body and is cohesively and electrically conductively connected to said electrode by means of a bottom connecting layer.

The semiconductor chip arrangements provided are arranged alongside one another on the carrier and in this state are embedded into the embedding compound. The embedding compound is then cured, such that the semiconductor chip arrangements together with the embedding compound form a solid composite. This composite constitutes an artificial wafer, which can then be processed further in any desired manner, for example in a wafer grinding installation. Prior to the further processing, the composite can be removed from the carrier. However, the further processing of the composite can also be carried out completely or partly for as long as the composite is still applied on the carrier.

A top cover layer, and optionally also a bottom cover layer, of the composite is removed from the composite, such that from the composite a residual composite remains. When the top cover layer is removed, the cured embedding compound is partly removed from the composite. Moreover, in each of the semiconductor chip arrangements the electrically conductive top compensation lamina of the relevant semiconductor chip arrangements is partly removed from the composite.

If a bottom cover layer is also removed from the composite, part of the cured embedding compound is likewise removed from the composite in this case. Moreover, in each of the semiconductor chip arrangements the electrically conductive bottom compensation lamina of the relevant semiconductor chip arrangements is partly removed from the composite.

The residual composite remaining after the removal of the top cover layer and, if appropriate, also of the optional bottom cover layer then still contains the semiconductor chips, the top connecting layers and the bottom connecting layers of each of the semiconductor chip arrangements. Moreover, in the residual composite in each of the semiconductor chip arrangements the residue of the top compensation lamina remaining after the top cover layer has been removed is not covered or at least not completely covered by the embedding compound. As a result, from the remaining residue of the top compensation lamina the side facing away from the semiconductor chip is exposed with respect to the embedding compound and can be subjected to electrical pressure contact-connection as a result. Insofar as a bottom cover layer was also removed, in the residual composite, moreover, in each of the semiconductor chip arrangements the residue of the bottom compensation lamina remaining after the removal of the bottom cover layer is not covered or at least not completely covered by the embedding compound. As a result, from the remaining residue of the bottom compensation lamina the side facing away from the semiconductor chip is exposed with respect to the embedding compound and can be subjected to electrical pressure contact-connection as a result.

The residual composite formed in this way can subsequently be singulated to form a number of chip assemblies, each of which contains one of the semiconductor chip arrangements and a residue of the embedding compound which encloses the semiconductor chip of the relevant chip assembly laterally circumferentially in a ring-shaped fashion in such a way that that side of the (part—which remained after the removal of the top cover layer—of the) top compensation lamina of this chip assembly which faces away from the semiconductor body is exposed in the embedding compound and can be subjected to electrical pressure contact-connection, and that the side—facing away from the semiconductor body—of the bottom compensation lamina (or, insofar as a bottom cover layer was removed from the composite, the part—which remained after the removal of the bottom cover layer—of the bottom compensation lamina) of this chip assembly is exposed in the embedding compound and can be subjected to electrical pressure contact-connection.

With chip assemblies produced in this way, the semiconductor arrangements already described can then be produced. In this case, all the chip assemblies of the semiconductor arrangement can result from the same or else from two or more different artificial wafers. In the method for producing a semiconductor arrangement, accordingly, a number of such chip assemblies are provided. A top contact plate and a bottom contact plate are likewise provided.

From the set of chip assemblies provided, a selection is then used for producing the semiconductor arrangement. In this case, the selection can comprise all of the chip assemblies provided, or only a portion of the chip assemblies provided. The use of only a portion of the chip assemblies provided in the semiconductor arrangement to be produced opens up the possibility of compiling the chip assemblies of the selection with regard to corresponding or similar properties. By way of example, the selection can comprise chip assemblies having an identical or similar thickness, and/or chip assemblies having an identical or similar on resistance, and/or chip assemblies having an identical or similar dielectric strength, and/or chip assemblies having an identical or similar switching speed and/or only functional chip assemblies. For the compilation of the selection it is possible to use only a single one of the criteria mentioned, or else an arbitrary combination comprising two, more or all of the criteria mentioned.

Insofar as one criterion consists in selecting chip assemblies having an identical or similar parameter, the selection of suitable chip assemblies can be made by stipulating that the relevant parameter of the chip assemblies to be selected must lie in a specific, predefined range of values. It is likewise possible, however, to select from a larger set of chip assemblies provided for producing a semiconductor arrangement, as was described above, a requisite number of N chip assemblies which have the smallest variation with regard to a specific criterion. The smallest variation can be determined, for example, on the basis of the standard deviation or the variance of a specific parameter. By way of example, once again the thicknesses of the chip assemblies, the on resistance thereof, the dielectric strength thereof, the switching speed thereof, or the functionality thereof can be used as criteria or parameters.

A small variation of the thicknesses enables a particularly reliable electrical contact-connection of a plurality of mutually adjacent chip assemblies between plane-parallel contact areas of two contact plates of the semiconductor arrangement. A small variation of the on resistance leads to particularly homogeneous evolution of heat within the semiconductor arrangement. A small variation of the dielectric strength makes it possible that none of the chip assemblies need be operated far below its permissible loading range. Finally, what is achieved (in the case of a parallel connection of the chip assemblies) with a small variation of the switching speed is that all the chip assemblies switch on substantially simultaneously. This prevents a situation in which a current to be switched by the entire semiconductor arrangement, which current is intended ideally to be divided uniformly among all the chip assemblies of the semiconductor arrangement, owing to the delayed switch-on, is distributed only among a portion of the chip assemblies for a longer time and these are overloaded.

Independently of the criterion or criteria according to which the selection of the chip assemblies was made, the selection comprising at least $N \geq 2$ of the chip assemblies provided is arranged between the top contact plate and the bottom contact plate, to be precise in such a way that in each of the chip assemblies the side of the top compensation lamina facing away from the semiconductor body makes electrical and mechanical contact with the top contact plate, and that the side of the bottom compensation lamina facing away from the semiconductor body makes electrical and mechanical contact with the bottom contact plate.

In order to enable the electrical operation of such a semiconductor arrangement, the latter can be clamped in between an electrically conductive top pressure contact piece and an electrically conductive bottom pressure contact piece in such a way that there is a pressure contact between the top pressure contact piece and the top contact plate, without the top pressure contact piece and the top contact plate being cohesively connected, and that there is a pressure contact between the bottom pressure contact piece and the bottom contact plate, without the bottom pressure contact piece and the bottom contact plate being cohesively connected.

BRIEF DESCRIPTION OF THE DRAWINGS

The invention is explained below on the basis of exemplary embodiments with reference to the accompanying figures. In the figures, identical reference signs designate identical or identically acting parts. In the figures:

FIG. 10 shows the residual composite remaining after the removal of a top and a bottom cover layer from the composite shown in FIG. 8, FIG. 11 shows an enlarged portion of the residual composite in accordance with FIG. 10, FIG. 12 shows a plan view of a portion of the residual composite with one of the semiconductor arrangements, FIG. 13 shows a plan view of the entire residual composite.

DETAILED DESCRIPTION

Figure 1:
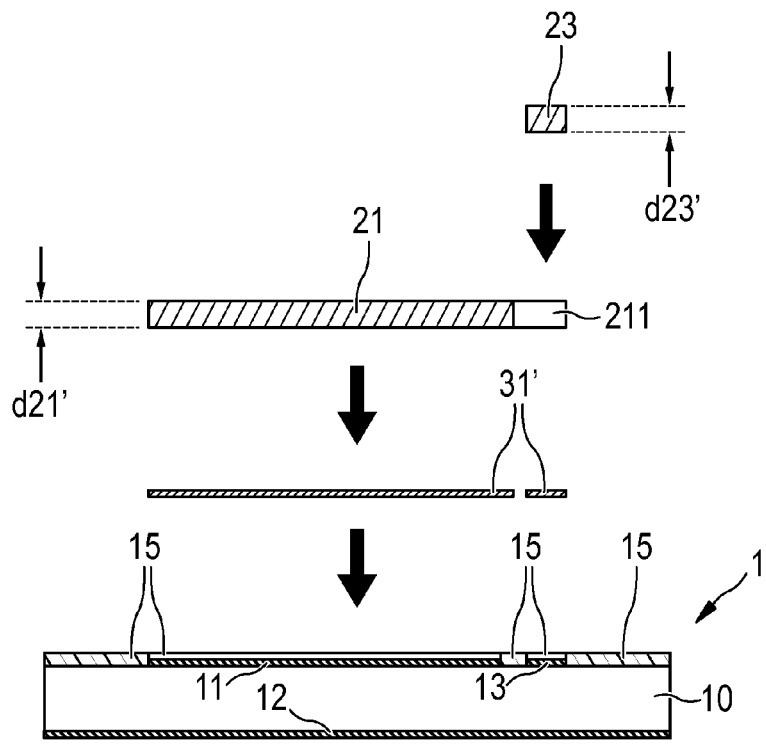
FIG. 1 shows a semiconductor chip with further parts for producing a semiconductor chip arrangement.
Figure 2:
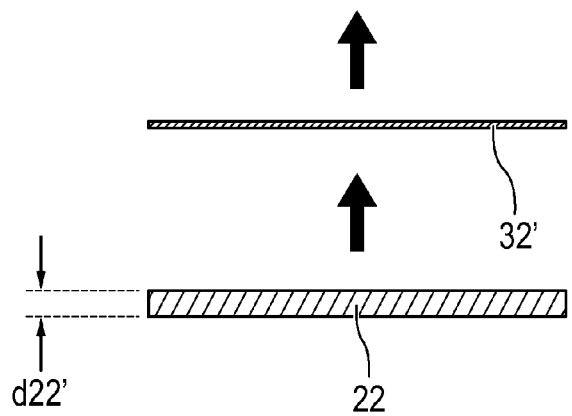
FIG. 2 shows the semiconductor chip arrangement produced from the semiconductor chip and the further parts in accordance with FIG. 1.

FIG. 1 shows a semiconductor chip 1 and further parts for producing a semiconductor chip arrangement 2, such as is illustrated in FIG. 2. The semiconductor chip 1 comprises a semiconductor body 10 composed of a basic semiconductor material, in which, in particular, p-conducting and n-conducting semiconductor zones are contained in order to realize a power semiconductor component integrated into the semiconductor body 10. Moreover, the semiconductor chip 1 can also have as many dielectric layers as desired, and electrically conductive layers such as, for example, metallizations, layers composed of doped polycrystalline semiconductor material such as, for example, polycrystalline silicon, silicide layers, but also arbitrary dielectric layers such as, for example, nitride layers (e.g. silicon nitride) or oxide layers (e.g. silicon oxide), or passivation layers such as e.g. imide layers. The basic semiconductor material can be any known basic semiconductor material that is customary for producing semiconductor components, for example arbitrary elemental semiconductors (e.g. silicon, germanium), arbitrary compound semiconductors (e.g. II-VI semiconductors such as zinc selenide or cadmium sulfide, III-V semiconductors such as gallium phosphide, gallium arsenide, indium phosphide, indium antimonide, or IV-IV semiconductors such as silicon carbide or silicon-germanium).

The semiconductor body 10 as a top side (at the top in FIG. 1) and an underside (at the bottom in FIG. 1) opposite the top side. The top side is spaced apart from the underside in a vertical direction v, wherein the vertical direction v runs perpendicularly to the underside. A top main electrode 11 is arranged on the top side, and a bottom main electrode 12 is arranged on the underside. An optional control electrode 13 is likewise situated on the top side. Furthermore, an optional top dielectric passivation layer 15 can be applied to the top side. These passivation layers 15 can be a polyimide, for example.

The top main electrode 11, the bottom main electrode 12 and—if present—the optional control electrode 13 can be thin metallization layers, for example. Such metallization layers can be applied to the semiconductor body 10 for example as early as during the production of the semiconductor chip 1 in the wafer assemblage with further, identical semiconductor chips 1, that is to say before the wafer has yet been singulated to form mutually independent semiconductor chips 1.

As is illustrated in FIG. 2, an electrically conductive top compensation lamina 21 is situated on the side of the top main electrode 11 facing away from the semiconductor body 10 and is cohesively connected to the top main electrode 11 by means of a top connecting layer 31. Correspondingly, an electrically conductive bottom compensation lamina 22 is situated on the side of the bottom main electrode 12 facing away from the semiconductor body 10 and is cohesively connected to the bottom main electrode 12 by means of a bottom connecting layer 32. Insofar as an optional control electrode 13 is present, there is also an electrically conductive contact piece 23, which is cohesively connected to the control electrode 13 by means of the top connecting layer 31. If such a contact piece 23 is provided, the adjacent top compensation lamina 21 can have a cutout 211 (FIG. 1), in which the contact piece 23 is positioned later.

The compensation laminae 21 and 22 and—if present—the contact pieces 23 have (before mounting on the top main electrode 11, the bottom main electrode 12 and the control electrode 13, respectively) relatively large thicknesses d21', d22' and d23', respectively, in the vertical direction, for example at least 0.5 mm, at least 1 mm, or at least 1.5 mm. The large thicknesses are intended to prevent damage to the chip metallizations 11, 12 and, if appropriate, 13 if the compensation laminae 21 and 22 and, if appropriate, the contact pieces 23 are ground, as will be explained later.

The main function of the compensation laminae 21, 22 is to reduce the mechanical stress of a pressure contact-connection which occurs as a result of the different coefficients of expansion of (pressure) contact plates 41 and 42 (e.g. composed of copper), as will be explained later, and the semiconductor material of the semiconductor chip 1. Without these compensation laminae 21, 22, in the best case the electrical properties of the chip would vary. In the worst case the semiconductor chip 1 would break.

Optionally, the top compensation lamina 21 and/or the bottom compensation lamina 22 can have a coefficient of linear thermal expansion that is significantly lower than the coefficient of linear thermal expansion of the top main electrode 11 and the bottom main electrode 12, in order to achieve an adaptation of the coefficient of linear thermal expansion to the low coefficient of linear thermal expansion of the semiconductor body 10. By way of example, the top compensation lamina 21 and/or the bottom compensation lamina 22, independently of one another, at a temperature of 20° C., can have a coefficient of linear thermal expansion of less than 11 ppm/K of even of less than 7 ppm/K. In this case, the top compensation lamina 21 and/or the bottom compensation lamina 22 can for example consist of one of the following materials or comprise one of the following constructions: molybdenum; a metal matrix composite material (MMC), for example AlSiC (aluminum silicon carbide); a multilayer material comprising two or more metal layers, for example comprising a molybdenum layer and a copper layer (e.g. a coefficient of linear thermal expansion of approximately 9.5 ppm/K can be achieved therewith).

The top connecting layer 31 can be embodied for example as an arbitrary solder layer, in particular also as a diffusion solder layer, as a sintered layer containing a sintered metal powder (e.g. silver powder or silver flakes), or an electrically conductive adhesive layer. Independently thereof, the bottom connecting layer 32 can also be embodied as an arbitrary solder layer, in particular also as a diffusion solder layer, as a sintered layer containing a sintered metal powder (e.g. silver powder or silver flakes), or an electrically conductive adhesive layer. The top connecting layer 31 and the bottom connecting layer 32 can consist of the same material, in particular; however, it is also possible to use arbitrary combinations of the materials mentioned for the two layers.

In FIG. 1, the materials used for producing the top connecting layer 31 and the bottom connecting layer 32 are designated by 31' and 32', respectively. This is intended to express the fact that the original connecting means 31' and 32' can be present in an altered form after the connection has been produced.

In the case of a connecting means 31', 32' embodied as solder (for example a tin-containing solder), the resulting connecting layer 31 and 32, respectively, can contain a material (e.g. copper) which diffused into the solder from the top main electrode 11 and the bottom main electrode 12, respectively, during the connection process and thus constitutes a constituent of the finished connecting layer 31 and 32 respectively. In order to produce the connections, the solder 31', 32' can be applied in the form of a solder paste, for example, to the main electrodes 11, 12 and/or to the compensation laminae (for example by screen or stencil printing). Likewise, however, the solder 31', 32' can also be introduced in the form of a prefabricated solder lamina (preform solder) between the top compensation lamina 21 and the top main electrode 11 and respectively between the bottom compensation lamina 22 and the bottom main electrode 12. In any case the solder paste or the solder lamina/laminae for producing the connections explained are melted and subsequently cooled, such that a cohesive connection in each case arises between the top compensation lamina 21 and the top main electrode 11 and respectively between the bottom compensation lamina 22 and the bottom main electrode 12.

In the case of a connecting layer 31 and 32 embodied as a sintered layer, the connecting means 31' and 32', respectively, on which said layer is based can be embodied as a paste containing a metal powder (e.g. silver powder or silver flakes) and a solvent. In order to produce the connections, the paste can be applied, for example, to the main electrodes 11, 12 and/or to the compensation laminae 21, 22 (for example by screen or stencil printing). A paste layer formed from the paste is then arranged between the top main electrode 11 and the top compensation lamina 21 and makes contact with them. Correspondingly, a further paste layer formed from the paste is arranged between the bottom main electrode 12 and the bottom compensation lamina 22 and makes contact with them. In this state, the paste layers are dried by evaporation of the solvent contained therein and are then sintered, wherein the sintering can be carried out at temperatures of significantly less than 250° C. As a result of the sintering, the (electrically conductive) top connecting layer 31 and respectively the (electrically conductive) bottom connecting layer 32 are formed from the two paste layers.

In the case of a connecting layer 31 and 32 embodied as an electrically conductive adhesive layer, the connecting means 31' and 32', respectively, on which said layer is based can be embodied as an electrically conductive adhesive. In order to produce the connections, the adhesive can be applied, for example, to the main electrodes 11, 12 and/or to the compensation laminae 21, 22 (for example by screen or stencil printing). An adhesive layer formed from the adhesive is then arranged between the top main electrode 11 and the top compensation lamina 21 and makes contact with them. Correspondingly, a further adhesive layer formed from the adhesive is arranged between the bottom main electrode 12 and the bottom compensation lamina 22 and makes contact with them. In this state, the adhesive layers are cured. As a result, the (electrically conductive) top connecting layer 31 and respectively the (electrically conductive) bottom connecting layer 32 are formed from the two adhesive layers.

If an optional contact piece 23 is provided, it can be cohesively connected to the control electrode 13 in the same way as the top compensation lamina 21 is connected to the top main electrode 11.

Figure 3:
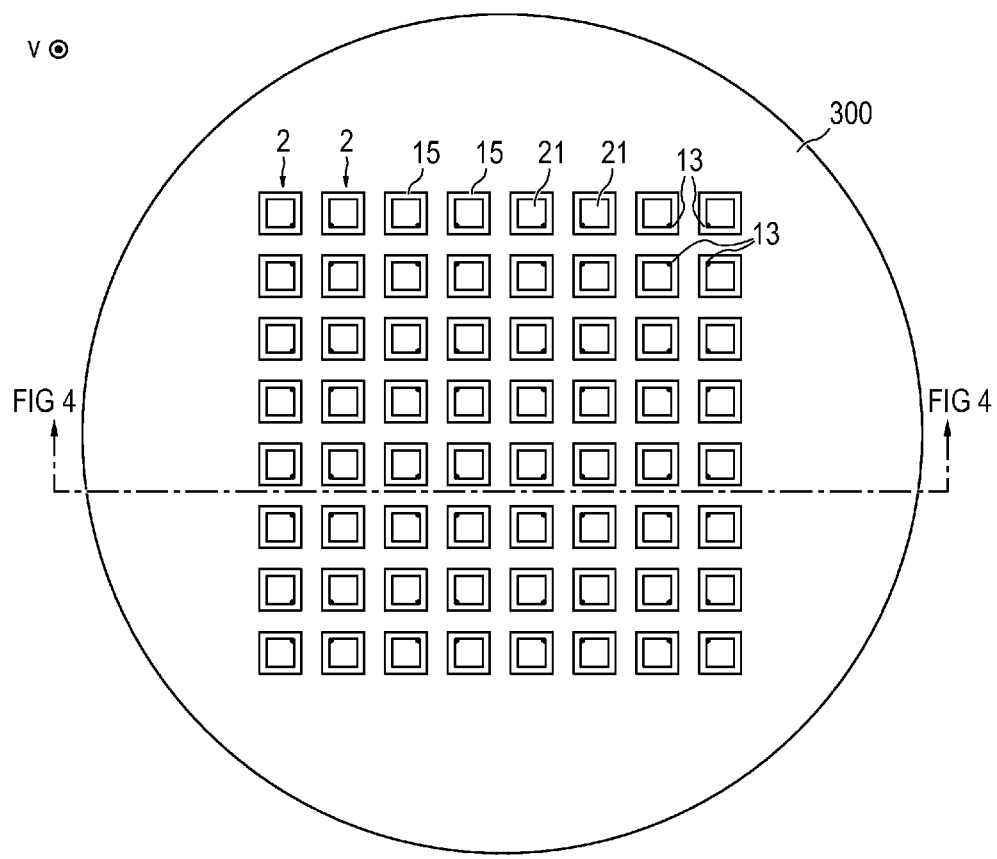
FIG. 3 shows a plan view of a carrier on which a plurality of semiconductor arrangements embodied in accordance with FIG. 2 are arranged alongside one another.

As is furthermore shown in FIG. 3, a plurality of semiconductor arrangements 2, each of which has a semiconductor chip 1 and, as explained, is equipped with a top and bottom compensation lamina 21 and 22, respectively, and optionally with a contact piece 23, are then placed alongside one another onto the same side of a common carrier 300.

Optionally, the placement can be effected—as shown—such that from all the semiconductor arrangements 2 the bottom compensation laminae 22 face the carrier 300 and the top compensation laminae 21 face away from the carrier 300. In principle, however, it is also possible, in one or more of the semiconductor arrangements 2, for the bottom compensation laminae 22 to face the carrier 300 and the top compensation laminae 21 to face away from the carrier 300, while in one or more other semiconductor arrangements 2 the top compensation laminae 21 face the carrier 300 and the bottom compensation laminae 22 face away from the carrier 300.

The placement of the semiconductor arrangements 2 on the carrier 300 can be effected such that they are situated in predefined positions relative to one another. In order to prevent the placed semiconductor arrangements 2 from slipping, the surface of the carrier 300 can be embodied such that the semiconductor arrangements 2 adhere thereto. By way of example, for this purpose the carrier 300 can have an adhesive film onto which the semiconductor arrangements 2 are placed.

Figure 4:
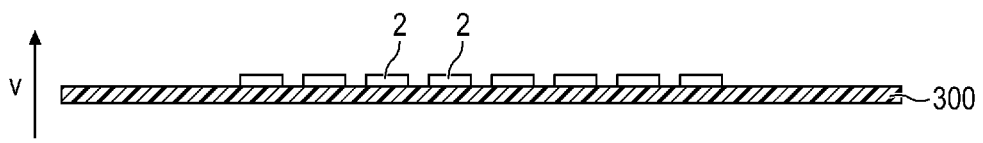
FIG. 4 shows a vertical section through the arrangement in accordance with FIG. 3.
Figure 5:
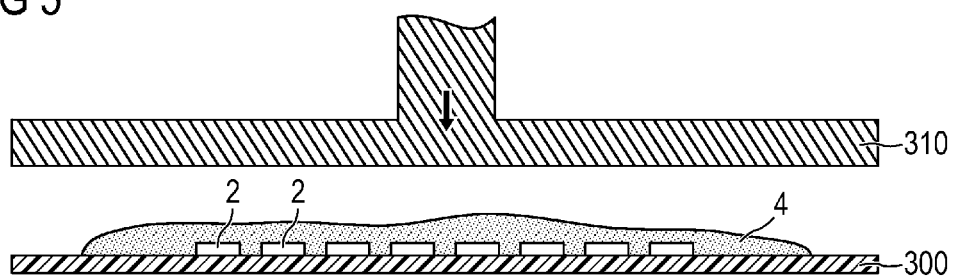
FIG. 5 shows the arrangement in accordance with FIG. 4 after the application of an embedding compound to the semiconductor arrangements situated on the carrier, before the embedding compound is pressed onto the carrier by means of a stamp.
Figure 6:
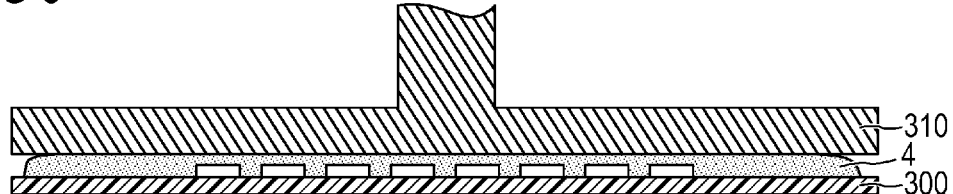
FIG. 6 shows the arrangement in accordance with FIG. 5 during the process of pressing the embedding compound onto the carrier.

FIG. 4 shows a vertical section through the carrier 300 equipped with the semiconductor arrangements 2. As is furthermore shown in FIGS. 5 and 6, a viscous embedding compound 4 is applied over the semiconductor arrangements 2 situated on the carrier 300. The embedding compound 4 is then pressed against the carrier 300 by means of a stamp 310, such that at least the interspaces situated between respectively adjacent semiconductor arrangements 2 are filled with the embedding compound 4.

Figure 7:
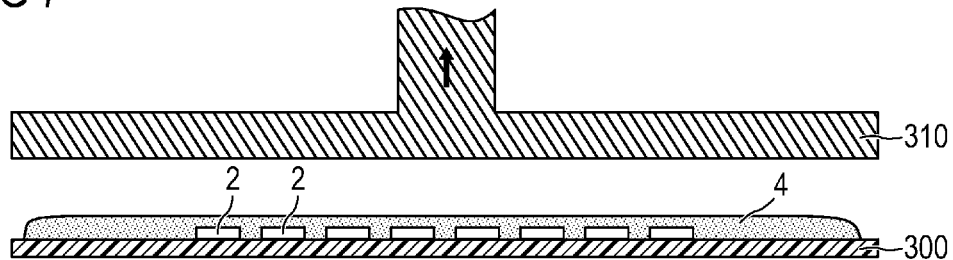
FIG. 7 shows the arrangement in accordance with FIG. 6 after the stamp has been lifted off.
Figure 8:
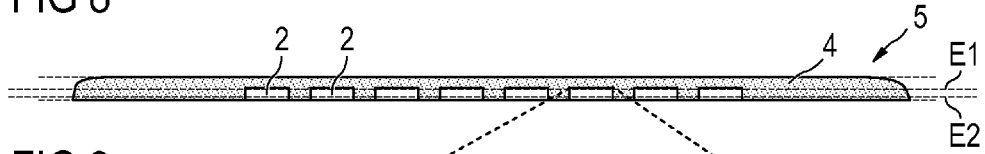
FIG. 8 shows the composite formed by the cured embedding compound and the semiconductor arrangements after the removal of the composite from the carrier.

The embedding compound 4 is then cured, such that the semiconductor chip arrangements 2 embedded into the embedding compound 4 together with the embedding compound 4 form a solid composite 5. As is furthermore shown in FIG. 7, the stamp 310 can be lifted off from the solid composite 5 after the curing of the embedding compound 4, and the composite 5 can be removed from the carrier 300. FIG. 8 shows the composite 5 then present. The embedding compound 4 is at least dielectric in the cured state. Examples of a suitable embedding compound include polycondensed polymers such as e.g. an epoxy resin or a polyurethane-based potting material.

Figure 9:
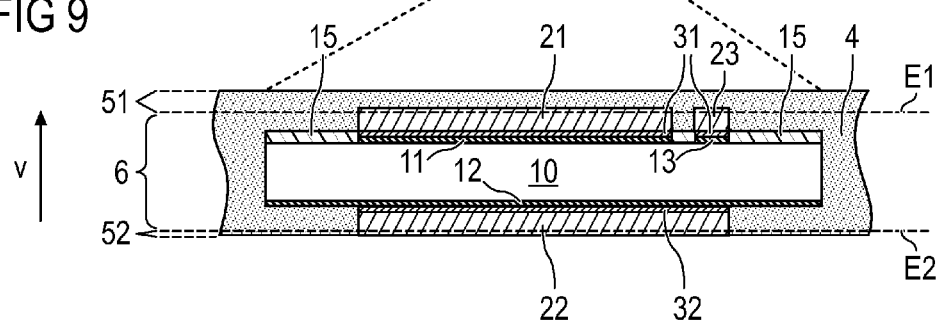
FIG. 9 shows an enlarged portion of the composite in accordance with FIG. 8 with one of the semiconductor arrangements.

A top cover layer 51 of the composite 5 and/or a bottom cover layer 52 of the composite 5 can then be removed from the composite 5, such that from the composite 5 a residual composite 6 remains. FIG. 8 and—in an enlarged excerpt—FIG. 9 show the composite 5 before the removal of here both a top cover layer 51 and a bottom cover layer 52. Correspondingly, FIG. 10 and—in an enlarged excerpt—FIG. 11 show the residual composite 6 after the removal of here both the top cover layer 51 and the bottom cover layer 52.

Insofar as a top cover layer 51 is removed from the composite, in this case the cured embedding compound 4 is partly removed from the composite 5. Moreover, in each of the semiconductor chip arrangements 2 the top compensation lamina 21 of the relevant semiconductor chip arrangement 2 is partly removed from the composite 5.

Insofar as, additionally or alternatively, a bottom cover layer 52 is removed from the composite, in this case the cured embedding compound 4 is likewise partly removed from the composite 5. Moreover, in each of the semiconductor chip arrangements 2 the bottom compensation lamina 22 of the relevant semiconductor chip arrangement 2 is partly removed from the composite 5.

The top cover layer 51 and/or the bottom cover layer 52 can be removed for example by the machining (grinding, polishing, lapping, etc.) of the composite 5 in a conventional wafer grinding installation. What can be achieved thereby is that the residual composite 6 (apart from small dishing effects) has plane-parallel surfaces at which the (ground) top compensation laminae 21, the (ground) bottom compensation laminae 22 and, if appropriate, the (ground) contact piece 23 terminate flush with the embedding compound 4.

After the removal of the top cover layer 51 and/or the bottom cover layer 52, the semiconductor chips 1, the top connecting layers 31 and the bottom connecting layers 32 of each of the semiconductor chip arrangements 2 remain in the residual composite 6. Moreover, in each of the semiconductor chip arrangements 2, insofar as a top cover layer 51 was removed, the residue of the top compensation lamina 21 remaining after the removal of the top cover layer 51 is then not covered or at least not completely covered by the embedding compound 4 and can be subjected to electrical pressure contact-connection as a result. Correspondingly, in each of the semiconductor chip arrangements 2, insofar as a bottom cover layer 52 was removed, the residue of the bottom compensation lamina 22 remaining after the removal of the bottom cover layer 52 is not covered or at least not completely covered by the embedding compound 4 and can be subjected to electrical pressure contact-connection as a result.

As a result of the removal of a top cover layer 51, the thickness d21 of the top compensation lamina 21 is reduced compared with its original thickness d21' (see FIG. 1), but it can still be, for example, at least 0.05 mm, at least 0.1 mm, or at least 0.2 mm. The same correspondingly applies to the thickness d23 of the contact piece 23 in comparison with the original thickness d23' thereof (see FIG. 1).

Moreover, as a result of the removal of a bottom cover layer 52, the thickness d22 of the bottom compensation lamina 22 is reduced compared with its original thickness d22' (see FIG. 1), but it can still be, for example, at least 0.05 mm, at least 0.1 mm, or at least 0.2 mm.

FIG. 12 shows a plan view of a portion of the residual composite 6. The contours of the semiconductor body 10 that are concealed by the embedding compound 4 are illustrated by dashed lines. As can be discerned here, moreover, the semiconductor chip 1 and thus also the semiconductor body 10 is surrounded by the embedding compound 4 in a ring-shaped fashion. The (ground) top compensation lamina 21 and the optional (ground) contact piece 23 are embedded into the embedding compound 4 in a flush fashion and are freely accessible, such that they can be electrically contact-connected without any problems.

Figure 14:
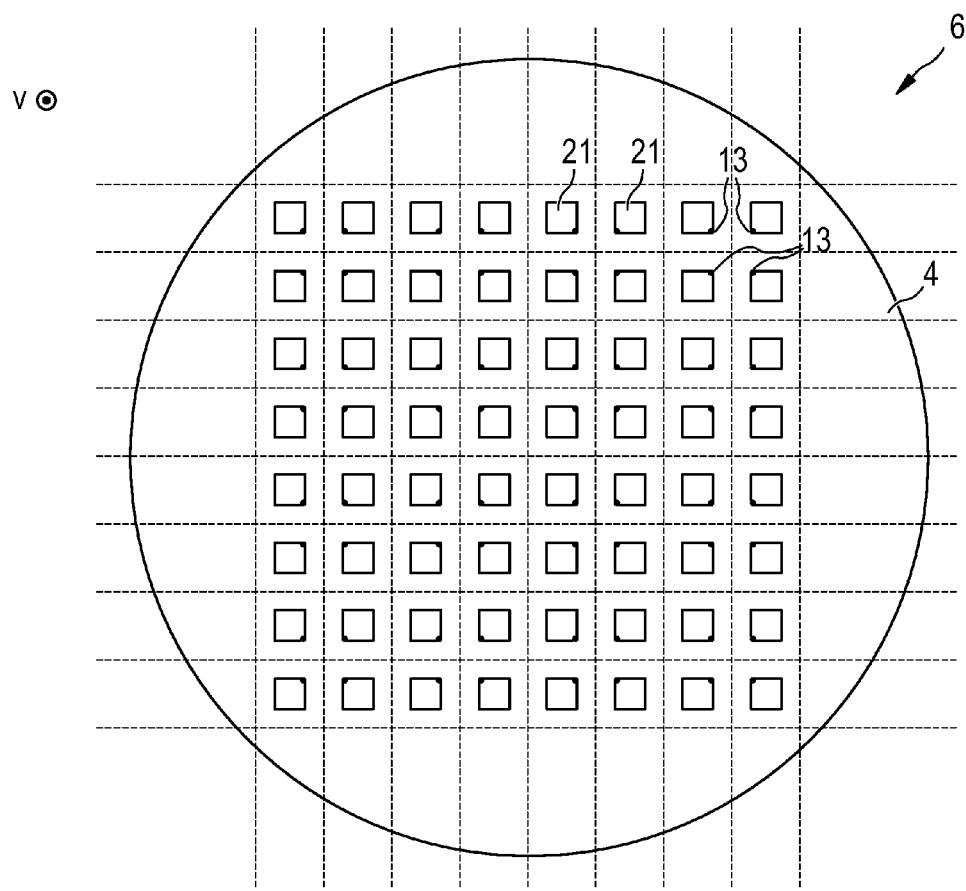
FIG. 14 shows the residual composite in accordance with FIG. 13 with cutting lines along which the residual composite is singulated to form individual chip assemblies.
Figure 15:
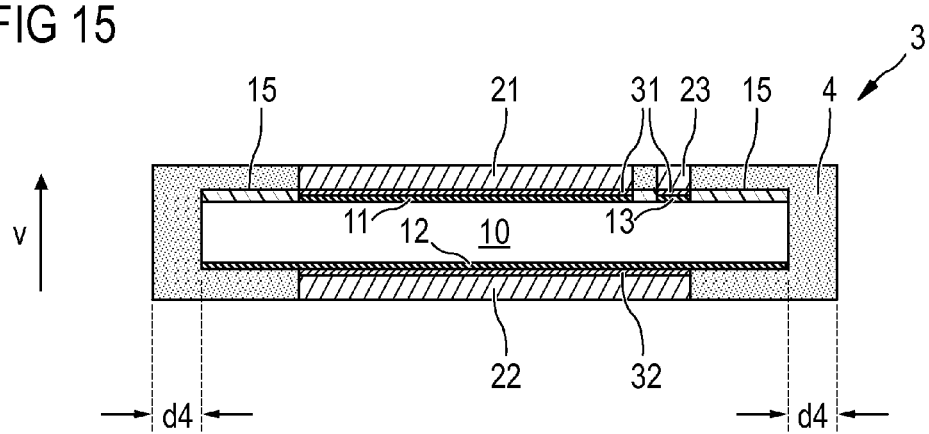
FIG. 15 shows a vertical section through one of the singulated chip assemblies.

FIG. 13 shows a plan view of the residual composite 6. FIG. 14 illustrates the same view, but additionally depicts dashed cutting lines along which the residual composite 6 is singulated to form chip assemblies 3, for example by sawing, water jet cutting or laser singulation, etc. FIG. 15 shows a vertical section through one of these singulated chip assemblies 3. In the case of the individual chip assemblies 3 as well, the embedding compound 4 encloses the semiconductor body 10 of the original semiconductor chip 1 laterally circumferentially in a ring-shaped fashion in such a way that those sides of the top compensation lamina 21 and of the optional contact piece 23 of this chip assembly 3 which face away from the semiconductor body 10 and that side of the bottom compensation lamina 22 of this chip assembly 3 which faces away from the semiconductor body 10 are exposed and can be subjected to electrical contact-connection externally as a result.

The embedding compound 4 firstly serves primarily to protect the edges of the semiconductor chips 1, but also to ensure the insulation strength of the chip assemblies 3. In order to ensure a sufficient insulation strength between directly adjacent chip assemblies 3 in the completed semiconductor arrangement 7, the embedding compound 4 can have a minimum thickness d4 perpendicularly to the vertical direction v between the lateral edge of the semiconductor body 10 and the lateral edge of the chip assemblies 3. By way of example, the thickness d4 can be at least 100 μm. The spacing between the semiconductor bodies 10 of the directly adjacent chip assemblies 3 is then at least 200 μm. Independently thereof, the construction of the semiconductor arrangement 7 can be chosen such that the spacing between the semiconductor bodies 10 of the directly adjacent chip assemblies 3 is then at most 5 mm or at most 2 mm.

Figure 16:
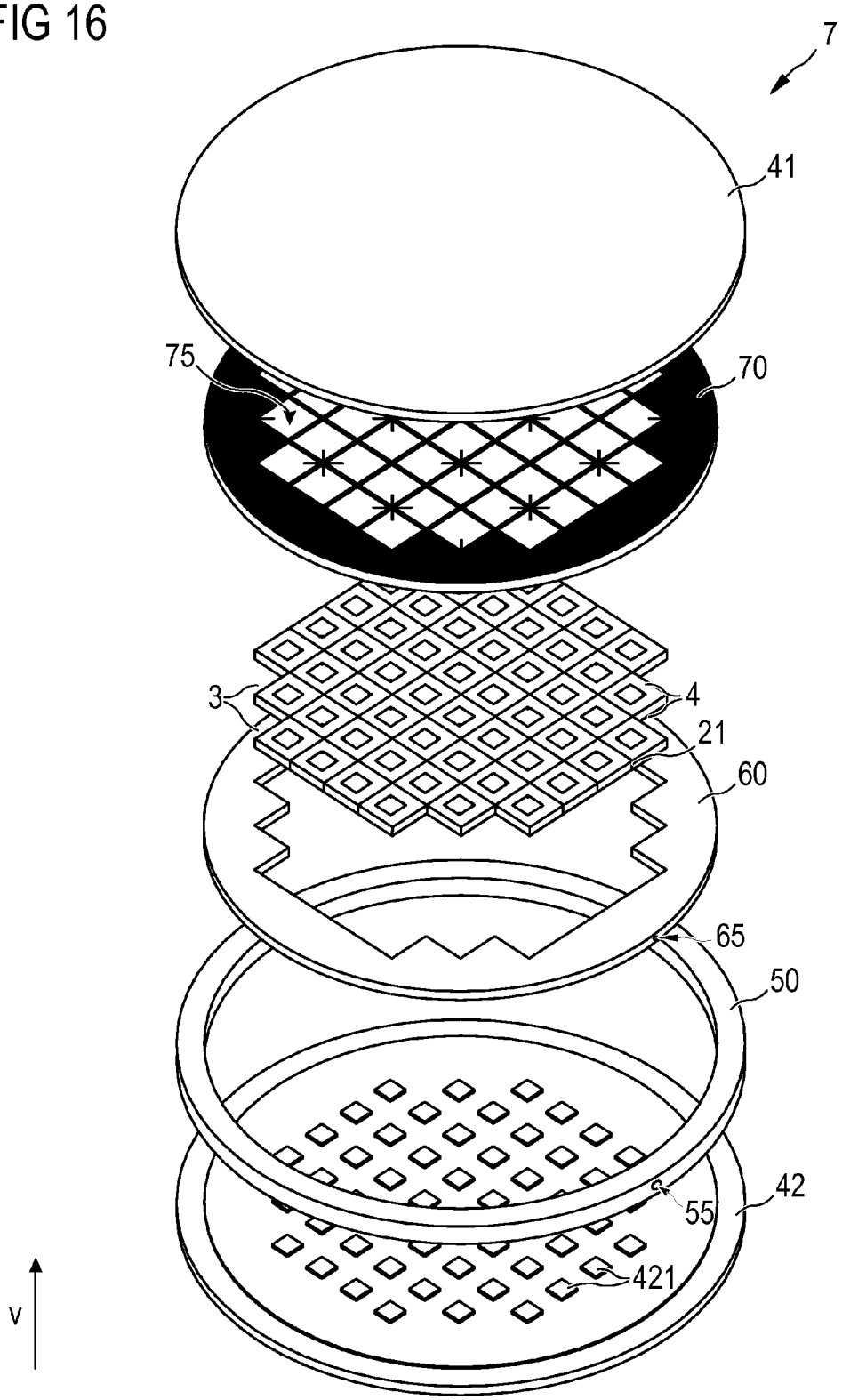
FIG. 16 shows an exploded illustration of a semiconductor arrangement comprising a plurality of singulated chip assemblies.
Figure 18:
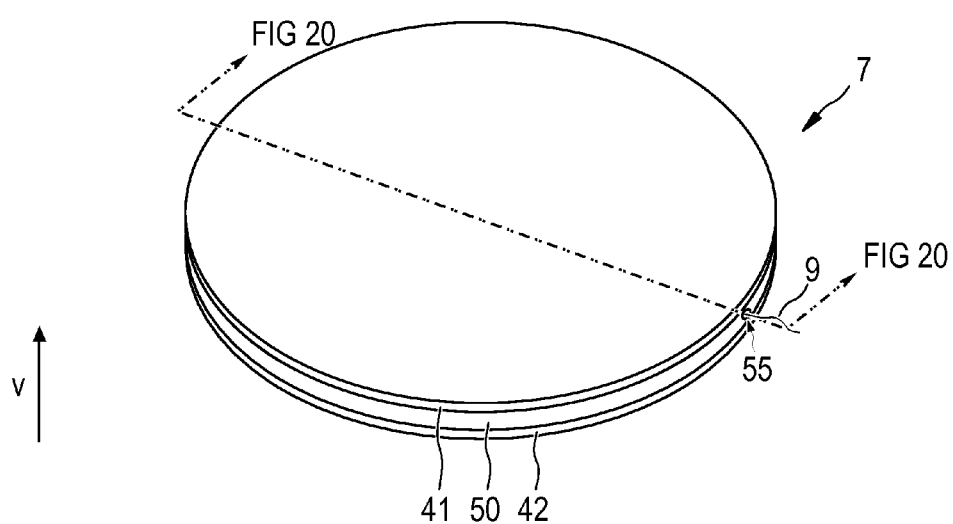
FIG. 18 shows a perspective view of the assembled semiconductor arrangement in accordance with FIG. 16.
Figure 19:
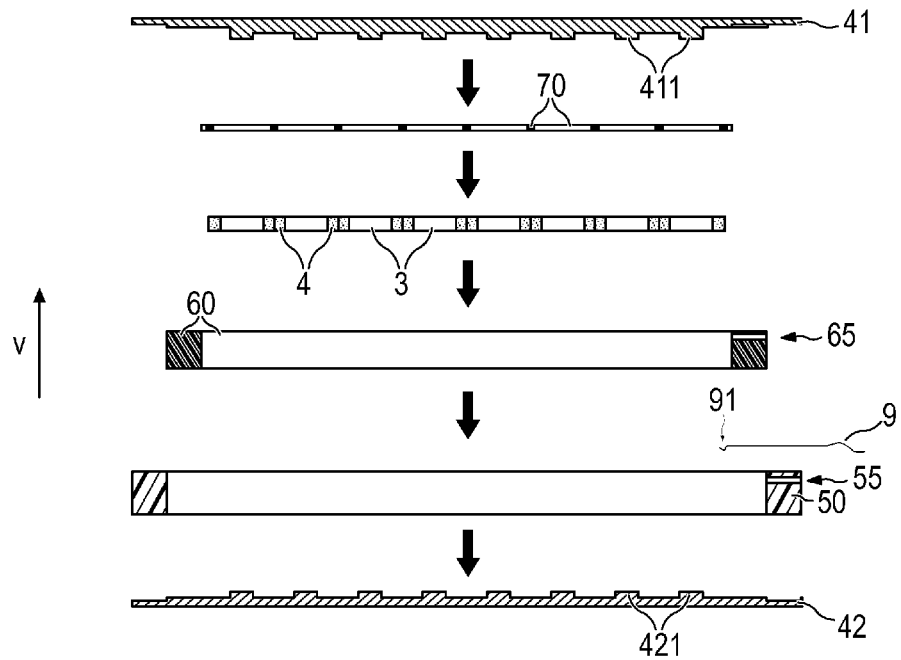
FIG. 19 shows a sectional view of the exploded illustration shown in FIG. 16.
Figure 20:
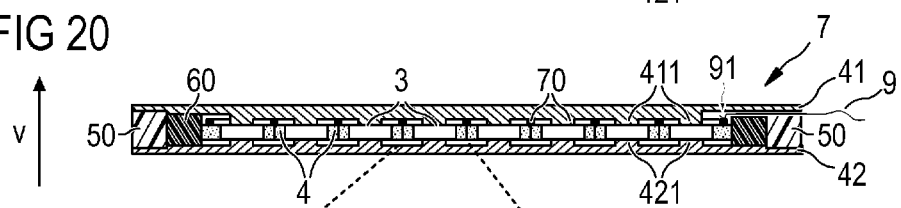
FIG. 20 shows a sectional view of the assembled semiconductor arrangement shown in FIG. 18.
Figure 21:
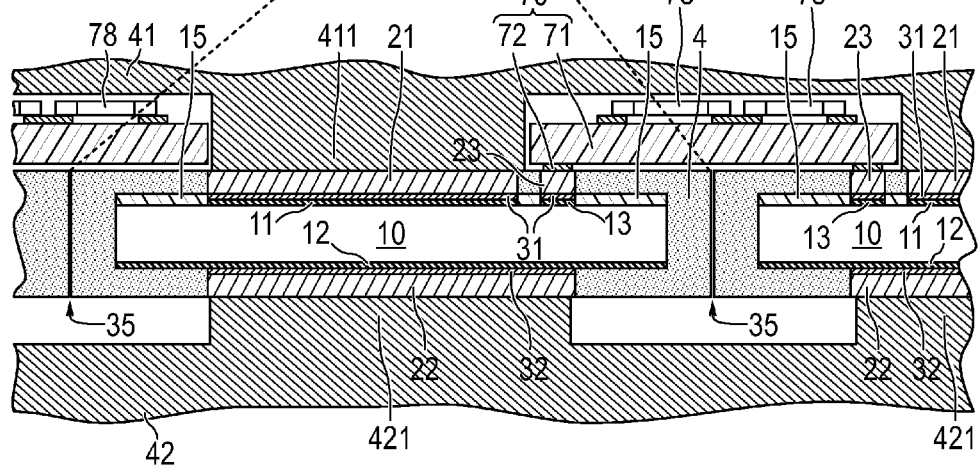
FIG. 21 shows an enlarged portion of the residual composite in accordance with FIG. 20.

Using two or more identical chip assemblies 3, or using two or more chip assemblies 3, each of which was produced according to the method explained above, a semiconductor arrangement 7 can then be produced. FIG. 16 shows an exploded illustration of such a semiconductor arrangement 7, FIG. 19 shows a cross section through the exploded illustration, FIG. 18 shows the finished assembled semiconductor arrangement 7, and FIG. 20 shows a cross section through the assembled semiconductor arrangement 7. An enlarged view of a portion of the arrangement illustrated in FIG. 20 is shown in FIG. 21.

As is firstly evident from FIG. 16, in particular, the semiconductor arrangement 7 firstly comprises two or more of such chip assemblies 3. The chip assemblies 3 are arranged between an electrically conductive top contact plate 41 and an electrically conductive bottom contact plate 42.

Figure 17:
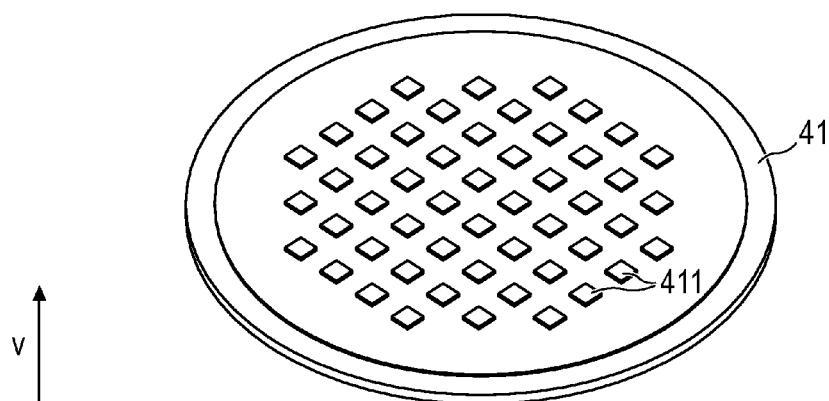
FIG. 17 shows a perspective view of the bottom contact plate shown in FIG. 16, looking at that side of said contact plate which faces the chip assemblies.

The top contact plate 41 serves to make electrical and mechanical contact with, from each of the chip assemblies 3, the compensation lamina 21, 22 (here: the top compensation laminae 21) facing the top contact plate 41. For this purpose, the top contact piece 41 has a contact pedestal 411 for each of the chip assemblies 3 (in this respect here see FIG. 17, which shows the top contact piece 41 in an upside down position relative to FIG. 16), which contact pedestal makes electrical and mechanical contact with one of the compensation laminae 21, 22 (here: the top compensation laminae 21) of the relevant chip assembly 3.

Correspondingly, the bottom contact plate 42 serves to make electrical and mechanical contact with, from each of the chip assemblies 3, the compensation lamina 21, 22 (here: the bottom compensation laminae 22) facing the bottom contact plate 42. For this purpose, the bottom contact piece 42 has a contact pedestal 421 for each of the chip assemblies 3, which contact pedestal makes electrical and mechanical contact with one of the compensation laminae 21, 22 (here: the bottom compensation laminae 22) of the relevant chip assembly 3.

Suitable materials for the top contact piece 41 and/or the bottom contact piece 42 include copper, for example, which optionally can be provided superficially with a thin nickel layer.

In the example shown, in each of the chip assemblies 3 of the semiconductor arrangement 7 the top contact lamina 21 is situated on the side of the chip assembly 3 facing the top contact plate 41, and the bottom contact lamina 22 is situated on the side of the chip assembly 3 facing the bottom contact plate 42.

In a departure therefrom, other semiconductor arrangements can have a first subset of the chip assemblies 3 and a second subset of the chip assemblies 3, wherein in each of the chip assemblies 3 of the first subset the top contact lamina 21 is situated on the side of the chip assembly 3 facing the top contact plate 41, and the bottom contact lamina 22 is situated on the side of the chip assembly 3 facing the bottom contact plate 42, and wherein in each of the chip assemblies 3 of the second subset the top contact lamina 21 is situated on the side of the chip assembly 3 facing the bottom contact plate 42, and the bottom contact lamina 22 is situated on the side of the chip assembly 3 facing the top contact plate 41.

It is likewise possible that in each of the chip assemblies 3 of a semiconductor arrangement the top contact lamina 21 is situated on the side of the chip assembly 3 facing the bottom contact plate 42, and the bottom contact lamina 22 is situated on the side of the chip assembly 3 facing the top contact plate 41.

The semiconductor arrangement 7 furthermore has a dielectric, for example ceramic, spacer ring 50 and an optional guide ring 60, which serves to hold the chip assemblies 3 together as a unit, without the individual chip assemblies 3 being displaced significantly relative to one another (apart from only very small relative displacements). The guide ring 60 can be embodied as shown such that it can be inserted flush into the spacer ring 50. As an alternative to a separate configuration of spacer ring 50 and guide ring 60, these two can also be embodied integrally, for example by the spacer ring 50 being shaped in its interior such that it performs the function of the guide ring 60.

As also in all of the other configurations of the invention the spacer ring 50 can be connected cohesively, for example by soldering, adhesive bonding or sintering, both to the top contact plate 41 and to the bottom contact plate 42.

If at least one of the chip assemblies 3 of the semiconductor arrangement 7 has a contact piece 3, an optional control electrode interconnection structure 70 can also be provided for the purpose of making electrical contact with this or, if appropriate, these contact piece(s) 3. Such a control electrode interconnection structure 70 serves for making electrical contact with one or more contact pieces 23, in the example shown in the present case for making electrical contact with the contact pieces 23 that are exposed at the side of the chip assemblies 3 facing the top contact piece 41.

In particular, the contact pieces 23 of two, more than two or all chip assemblies 3 of the semiconductor arrangement 7 can be electrically conductively connected to one another by the control electrode interconnection structure 70. As is furthermore shown on the basis of the present example, a control electrode interconnection structure 70 can have a netlike structure. Independently thereof, a control electrode interconnection structure 70 can be embodied as a modular unit, for example.

As is furthermore illustrated in FIG. 16, the control electrode interconnection structure 70 can have through openings 75 through which the contact pedestals 411 (FIG. 17) of the top contact plate 41 can make electrical and mechanical contact with the compensation laminae 21 and/or 22 of the chip assemblies 3 facing in the direction of the top contact plate 41.

As an alternative or in addition to a control electrode interconnection structure 70 which, as shown in the present case, is arranged between the chip assemblies 3 and the top contact plate 41, the control electrode interconnection structure 70 or a further control electrode interconnection structure could also be arranged between the chip assemblies 3 and the bottom contact plate 42 in order to electrically connect contact pieces 23 that are exposed at the side of the chip assemblies 3 facing the bottom contact piece 42. Such a control electrode interconnection structure could also have through openings through which the contact pedestals 421 (FIG. 16) of the bottom contact plate 42 can make electrical and mechanical contact with the compensation laminae 21 and/or 22 of the chip assemblies 3 facing in the direction of the bottom contact plate 42.

If one or two control electrode interconnection structures 70 is/are present, an electrically conductive control contact 9 (see FIG. 19) can be provided for each of the control electrode interconnection structures 70 in order to be able to make electrical contact with the relevant control electrode interconnection structure 70 from outside the completed semiconductor arrangement 7 (see FIG. 18). For this purpose, the control contact 9 can be led for example through a through opening or groove 55 formed in the spacer ring 50 and, in the case of an optional guide ring 60, also through a through opening or groove 65 formed in the guide ring 60 to the outer side of the semiconductor arrangement 7.

Within the spacer ring 50, the control contact 9 is then electrically conductively connected to the control electrode interconnection structure 70 and thus to the control electrodes 13. In order to realize the electrical connection between the control contact 9 and the control electrode interconnection structure 70, the control contact 9 can have a contact spring 91, for example, which is prestressed during the mounting of the semiconductor arrangement 7 or in some other way and is thereby pressed against the control electrode interconnection structure 70 and makes electrical contact therewith.

As can furthermore be discerned with the aid of an enlarged cross-sectional view of a portion of the semiconductor arrangement 7 as shown in FIG. 21, a control electrode interconnection structure 70 can be embodied, for example, as a printed circuit board (e.g. FR4) having a dielectric carrier 71 and a conductor structure 72, e.g. a metallization, applied to the carrier 71 and fixedly connected thereto.

In the case of a semiconductor arrangement 7 as described in the present case, the individual chip assemblies 3 can be loosely clamped in and electrically contact-connected between the top contact plate 41 and the bottom contact plate 42. The relevant electrical contact-connections between the chip assemblies 3 and the top contact plate 41 (i.e. between each of the top compensation laminae 21 and the top contact plate 41) and those between the chip assemblies 3 and the bottom contact plate 42 (i.e. between each of the bottom compensation laminae 22 and the bottom contact plate 42) can therefore be embodied exclusively as pressure contacts and thus without a cohesive connection.

It can likewise be discerned in FIG. 21 that respectively adjacent chip assemblies 3 can be arranged very closely alongside one another and alongside one another with only a narrow gap 35, for example having a width of less than 100 µm. However, adjacent chip assemblies 3 can have, in principle, arbitrary spacings from one another.

Figure 22:
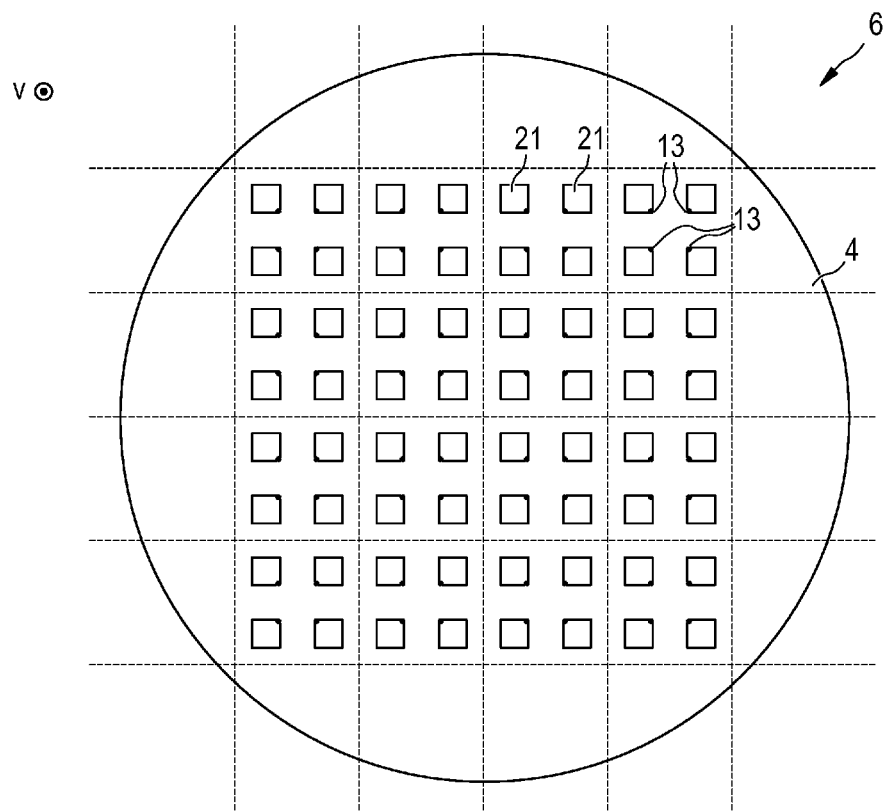
FIG. 22 shows the residual composite in accordance with FIG. 13 with cutting lines along which the residual composite is singulated to form individual chip assemblies, wherein each of the chip assemblies comprises at least two of the semiconductor arrangements.
Figure 23:
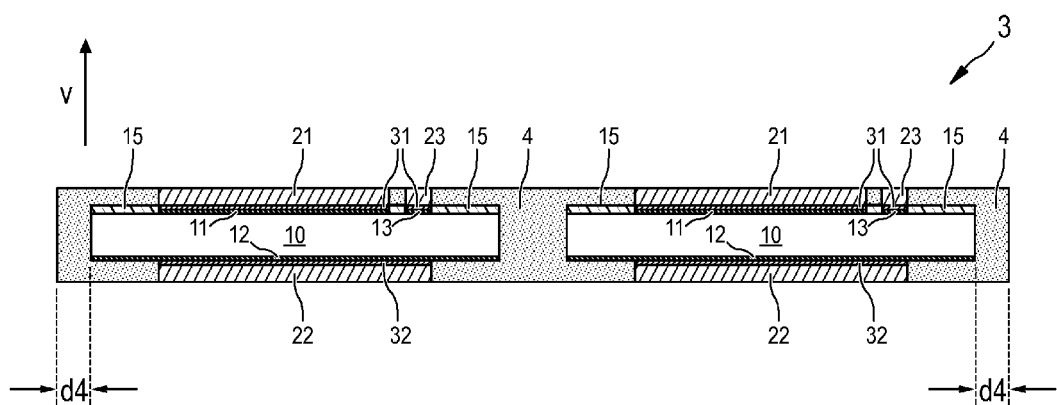
FIG. 23 shows a vertical section through one of the singulated chip assemblies in accordance with FIG. 22.

While in the example shown each of the chip assemblies 3 contains only exactly one semiconductor chip 1, in principle there is also the possibility of a chip assembly 3 containing two or more identical or different semiconductor chips 1. One example of this is shown in FIG. 22. This involves the residual composite 6 already shown in FIGS. 13 and 14, but with the difference relative to FIG. 14 that cutting lines illustrated in a dashed manner proceed such that after the residual composite 6 has been singulated to form individual chip assemblies 3, each of the singulated chip assemblies 3 contains at least two (here: four) semiconductor chips 1. FIG. 23 shows an enlarged sectional view through such a chip assembly 3.

One advantage of the present invention is that the individual chip assemblies 3 are tested in each case separately with regard to their functionality and/or with regard to other properties and are selected according to specific criteria, as already explained, and are inserted in a common semiconductor arrangement 7.

Figure 24:
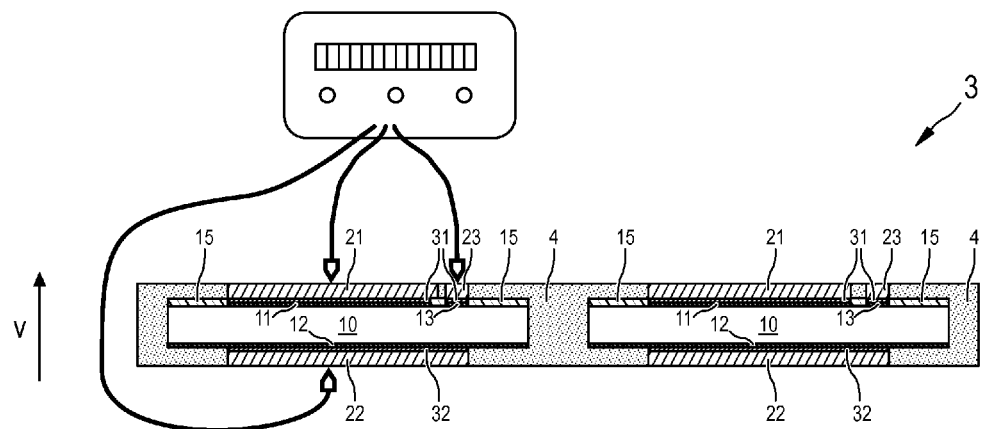
FIG. 24 shows a test on an individual chip assembly.

FIG. 24 shows by way of example the performance of a functional test on a semiconductor chip 1 contained in a chip assembly 3 with the aid of a test device.

A further advantage is that the different chip assemblies 3 of a semiconductor arrangement 7 have only small thickness tolerances, primarily if all the chip assemblies 3 of the completed semiconductor arrangement 7 originate from the same residual composite 6.

Figure 25:
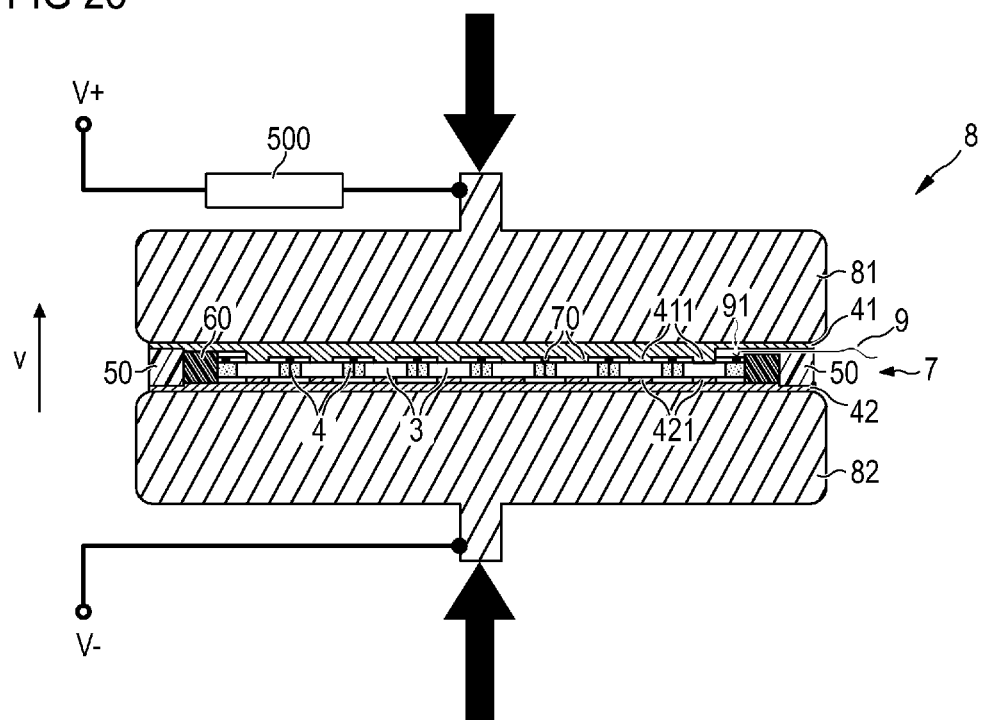
FIG. 25 shows a semiconductor arrangement clamped in between a top pressure contact piece and a bottom pressure contact piece and thereby subjected to pressure contact-connection.

A semiconductor arrangement 7 according to the present invention, as is shown by way of example in FIG. 25, can then be clamped in between an electrically conductive top pressure piece 81 and an electrically conductive bottom pressure piece 82 in such a way that there is in each case an electrical pressure contact-connection between the top pressure piece 81 and the top contact plate 41 and between the bottom pressure piece 82 and the bottom contact plate 42. The finished pressure contact arrangement 8 comprising the semiconductor arrangement 7, the top pressure piece 81 and the bottom pressure piece 82 can then be electrically interconnected. By way of example, the pressure contact arrangement 8 can be connected in series with a resistive and/or inductive load 500 between a positive supply potential V+ and a negative supply potential V−.

In the case of a semiconductor arrangement within the meaning of the present invention, an arbitrary number of mutually separate semiconductor bodies 100 can be fixedly connected to one another by the embedding compound 4. The number can be, for example, at least 9, at least 25 or at least 36.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor arrangement, comprising:
   a top contact plate and a bottom contact plate;
   a plurality of chip assemblies alongside one another within a layer, each of which comprises:
     a semiconductor chip having a semiconductor body, the semiconductor body having a top side and an underside opposite the top side;
     a top main electrode arranged on the top side;
     a bottom main electrode arranged on the underside;
     an electrically conductive top compensation lamina arranged on a side of the top main electrode facing away from the semiconductor body and cohesively and electrically conductively connected to the top main electrode by a top electrically conductive connecting layer;
     an electrically conductive bottom compensation lamina arranged on a side of the bottom main electrode facing away from the semiconductor body and cohesively and electrically conductively connected to the bottom main electrode by a bottom electrically conductive connecting layer; and a dielectric embedding compound which encloses the semiconductor chip laterally circumferentially in a ring-shaped fashion such that a side of the top compensation lamina facing away from the semiconductor body and a side of the bottom compensation lamina facing away from the semiconductor body are at least not completely covered by the embedding compound and are exposed as a result, while edges of the top compensation lamina and the bottom compensation lamina are enclosed by the dielectric embedding compound;

wherein each of the chip assemblies is arranged between the top contact plate and the bottom contact plate such that:

the side of the top compensation lamina facing away from the semiconductor body makes electrical and mechanical contact with the top contact plate; and the side of the bottom compensation lamina facing away from the semiconductor body makes electrical and mechanical contact with the bottom contact plate, and wherein at least one of the top compensation lamina and the bottom compensation lamina has a coefficient of linear thermal expansion of less than 11 ppm/K.

2. The semiconductor arrangement of claim 1, further comprising a dielectric spacer ring arranged between the top contact plate and the bottom contact plate and which surrounds the chip assemblies.

3. The semiconductor arrangement of claim 2, further comprising a dielectric guide ring arranged between the chip assemblies and the dielectric spacer ring.

4. The semiconductor arrangement of claim 1, wherein the top contact plate has a contact pedestal on a side facing the bottom contact plate for each of the chip assemblies, wherein the contact pedestal makes electrical and mechanical contact with the side of the top compensation lamina facing away from the respective semiconductor body.

5. The semiconductor arrangement of claim 1, wherein the bottom contact plate has a contact pedestal on a side facing the top contact plate for each of the chip assemblies, wherein the contact pedestal makes electrical and mechanical contact with the side of the bottom compensation lamina facing away from the respective semiconductor body.

6. The semiconductor arrangement of claim 1, wherein in each of the chip assemblies:

the semiconductor body has a control electrode arranged at the top side of the semiconductor body and by which an electric current between the top main electrode and the bottom main electrode can be controlled;

an electrically conductive contact piece arranged on a side of the control electrode facing away from the semiconductor body and cohesively and electrically conductively connected to the control electrode by the top electrically conductive connecting layer;

wherein the semiconductor arrangement has a control electrode interconnection structure, which, in each of the chip assemblies, makes electrical and mechanical contact with a side of the electrically conductive contact piece which faces away from the respective semiconductor body.

7. The semiconductor arrangement of claim 6, wherein the control electrode interconnection structure is a printed circuit board.

8. The semiconductor arrangement of claim 1, wherein at least one of:

the top electrically conductive connecting layer is a solder layer, an electrically conductive adhesive layer, or an electrically conductive sintered layer; and the bottom electrically conductive connecting layer is a solder layer, or an electrically conductive adhesive layer, or an electrically conductive sintered layer.

9. The semiconductor arrangement of claim 1, wherein two directly adjacent chip assemblies have a spacing of less than or equal to 100 μm.

10. The semiconductor arrangement of claim 1, wherein the semiconductor bodies of directly adjacent chip assemblies have a spacing of at least 200 μm.

11. The semiconductor arrangement of claim 1, wherein in at least one of the chip assemblies the embedding compound has a thickness of at least 100 μm perpendicularly to a vertical direction between a lateral edge of the embedding compound and a nearest lateral edge of the semiconductor body.

12. The semiconductor arrangement of claim 1, wherein in at least one of the chip assemblies:

the top compensation lamina has a thickness of at least 0.5 mm in a vertical direction; and/or the bottom compensation lamina has a thickness of at least 0.5 mm in the vertical direction.

* * * * *